United States Patent
Perndl et al.

(10) Patent No.: US 8,288,864 B2
(45) Date of Patent: Oct. 16, 2012

(54) MICROWAVE MODULE

(75) Inventors: Werner Perndl, Vaterstetten (DE); Thomas Reichel, Baldham (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 167 days.

(21) Appl. No.: 12/937,967

(22) PCT Filed: Mar. 10, 2009

(86) PCT No.: PCT/EP2009/001703
§ 371 (c)(1), (2), (4) Date: Oct. 14, 2010

(87) PCT Pub. No.: WO2009/127300
PCT Pub. Date: Oct. 22, 2009

(65) Prior Publication Data
US 2011/0031595 A1 Feb. 10, 2011

(30) Foreign Application Priority Data
Apr. 16, 2008 (DE) .......... 10 2008 019 094
Jun. 5, 2008 (DE) .......... 10 2008 026 765

(51) Int. Cl.
*H01L 23/34* (2006.01)
*H01L 29/66* (2006.01)

(52) U.S. Cl. .......... 257/728; 257/275; 257/E27.14; 257/E21.331

(58) Field of Classification Search .......... 257/199, 257/275, 482, 604, 728, E27.14, E21.331
See application file for complete search history.

(56) References Cited

U.S. PATENT DOCUMENTS

| | | | |
|---|---|---|---|
| 3,903,590 A | 9/1975 | Yokogawa | |
| 4,544,989 A | 10/1985 | Nakabu et al. | |
| 4,682,414 A | 7/1987 | Butt | |
| 5,602,421 A * | 2/1997 | Li | 257/728 |
| 5,768,109 A * | 6/1998 | Gulick et al. | 361/794 |
| 6,057,593 A * | 5/2000 | Iovdalsky et al. | 257/659 |
| 7,719,104 B2 * | 5/2010 | Hsu et al. | 257/699 |
| 2003/0042582 A1 | 3/2003 | Crane, Jr. | |

FOREIGN PATENT DOCUMENTS

| | | |
|---|---|---|
| DE | 199 24 960 A1 | 12/2000 |
| DE | 103 13 590 A1 | 10/2004 |

(Continued)

OTHER PUBLICATIONS

Cooper, P.D., et al., "Multichip-on-Flex Plastic Encapsulated MHDI—Low Cost Substrateless Manufacturing for Microwave and Millimeterwave Modules," IEEE MIT-S Digest, XP-000704887, pp. 219-222, Jun. 17, 1996.

International Search Report mailed Jun. 3, 2009, in corresponding International Application No. PCT/EP2009/001703, filed Mar. 10, 2009.

(Continued)

*Primary Examiner* — Michelle Mandala
(74) *Attorney, Agent, or Firm* — Christensen O'Connor Johnson Kindness PLLC

(57) ABSTRACT

In a microwave module with at least one semiconductor chip, which provides on its upper side a connecting-line structure formed in particular as a coplanar line, which is connected to at least one adjacent incoming and/or outgoing line structure formed on the upper side of the substrate, the chip is glued with its underside and all lateral surfaces, on which no high-frequency connecting lines lead to the chip, within a recess of a metal part with good thermal conduction.

4 Claims, 1 Drawing Sheet

FOREIGN PATENT DOCUMENTS

| | | | |
|---|---|---|---|
| DE | 10 2007 024 413 | A1 | 12/2007 |
| DE | 10 2007 013 968 | A1 | 5/2008 |
| EP | 0 747 997 | A2 | 12/1996 |
| EP | 0 800 093 | B1 | 6/2004 |
| JP | 63 079365 | A | 4/1988 |
| KR | 4 207 92 | B1 | 5/2004 |

OTHER PUBLICATIONS

English Translation of International Preliminary Report on Patentability mailed Jan. 27, 2011, in corresponding International Application No. PCT/EP2009/001703, filed Mar. 10, 2009.

* cited by examiner

MICROWAVE MODULE

The invention relates to a microwave module according to the preamble of claim 1.

In microwave modules of this kind, the problem often arises of removing from a sensitive semiconductor chip heat, which occurs through power loss of the structural elements attached to the chip, as well as possible from the chip. Similarly, for example, in the case of thermal power sensors, there is a need to minimise temperature gradients occurring on a chip, for example, through thermal fluxes. The solutions hitherto provided for this problem, for example, from DE 10 2007 024 413 A1, by placing or gluing the semiconductor chip with its flat underside on the microwave circuit bearing the connecting-line structure of the chip, only resolve this problem in an inadequate manner.

The object of the invention is therefore to provide for a microwave module of the type specified a structure, through which the heat occurring in the semiconductor chip is dissipated as well as possible to its surroundings and which at the same time ensures as constant a temperature distribution over the chip as possible.

This object is achieved according to the invention by the microwave module specified in the independent claim 1. Advantageous further developments are specified in the dependent claims.

Optimum thermal dissipation from the semiconductor chip is achieved by gluing the semiconductor chip as far as possible on all sides in a countersunk manner within a recess of a metal part of good thermal conduction by means of an adhesive also of good thermal conductivity. However, a simple high-frequency coupling of the connecting-line structure of the semiconductor chip to adjacent incoming and/or outgoing structures, for example, via bond wires or small foil pieces, on the surface of which corresponding connecting-line structures are formed, is possible. The invention is accordingly particularly advantageous, for example, for thermal power measuring cells, which are attached to a semiconductor chip and to which the high-frequency to be measured is supplied from externally via a microwave terminal line structure and from which any influx of heat from externally falsifying the measurement must be avoided. However, the invention can be used in a similar manner, for example, with semiconductor chips, on which active structural elements generating a power loss, for example, high-frequency power amplifier elements or similar are formed, and with which this power-loss heat must be dissipated as well as possible from the chip.

The invention is explained in greater detail below on the basis of an exemplary embodiment with reference to a schematic drawing. The drawings are as follows.

Figure 1:
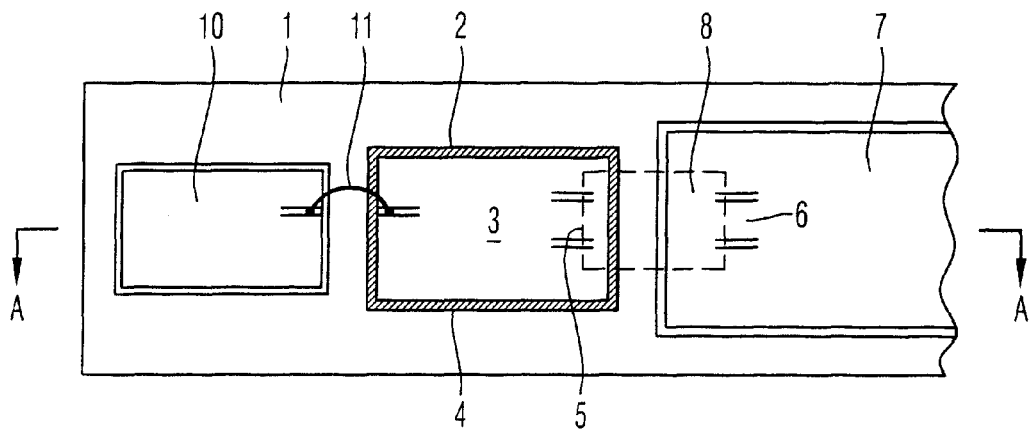
FIG. 1 shows a plan view of a microwave module according to the invention.
Figure 2:
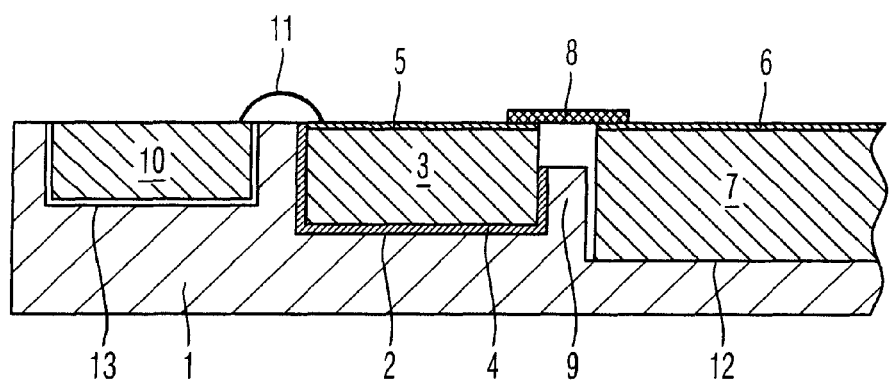
FIG. 2 shows a section along the line A-A according to FIG. 1.

The microwave module presented in FIG. 1 consists of a flat metal part 1 with good thermal conduction, for example, copper. A semiconductor chip 3 is inserted in a first flat recess 2. The drawings show the module in an extremely enlarged scale; the thickness of the semiconductor chip illustrated is, for example, only 200 μm, the lateral dimensions only 1-2 mm. The recess 2 corresponds in its outline to that of the semiconductor chip 3. The gap existing in the inserted condition between the chip 3 and the lateral walls of the recess 2 is as small as possible and is, for example, only 30-50 μm. The chip 3 is glued into the recess 2 on all sides, that is to say, the gap between the base and the lateral walls of the recess 2 and the underside and respectively the lateral surfaces of the chip 3 is completely filled with adhesive. An adhesive with high thermal conductivity is suitable as the glue, so that a good thermal connection between the semiconductor chip and the surrounding metal part 1 is provided. By preference, an adhesive is used, which hardens at a relatively low temperature, so that thermal stresses are avoided during manufacture.

On the upper side of the semiconductor chip, a schematically indicated connecting-line structure 5 for the semiconductor components formed on the chip is provided, which is electrically connected to adjacent incoming and/or outgoing line structures 6 of an adjacent substrate 7. For a high-frequency connection, for example, bond wires or a connecting-line structure formed on a small foil piece 8 can be used for this purpose. By preference, the wall 9 of the recess 2 accommodating the chip is reduced in height, for example, formed only at half height, in the region of this high-frequency connection so that interfering influences on the high-frequency field of the high-frequency connection 8 are avoided. If only a low-frequency or direct-current connection is required between the chip 3 and an adjacent substrate 10, as illustrated for the other side of the chip in FIG. 1, such a reduction in the height of the lateral wall is not required, because here, for example, bond wires used for the connection can bridge this metal web in an appropriate manner.

The adjacent substrates 7 and respectively 10, generally made of ceramic, on the surface of which the incoming and/or outgoing line structures for high-frequency or respectively low-frequency or direct current are formed, are also inserted in corresponding recesses 12 and respectively 13 of the metal part 1 and are preferably also glued there on all sides.

The connecting-line structure 5 on the chip 3 is preferably a coplanar line structure, but could also be designed using microstripline technology. The same applies for the incoming and/or outgoing line structure 6 of the adjacent substrate 7 for the high-frequency connection. If both line structures 5 and 6 are coplanar lines, a small foil piece 8, on which the connecting-line structure is also formed in coplanar line technology, indicated in FIG. 1 by a dotted line, is particularly suitable for the connection. This small foil piece 8 can be attached, for example, by a thermo-compression method directly to the upper side of the chip 3 or respectively of the substrate 7 made, for example, of ceramic. The depth of the recess for the chip 3 or respectively for the ceramic substrate 7 or 10 is based upon the thickness of these parts. By preference, the depth of these recesses in the metal part is selected in such a manner that the surfaces of the glued parts 2, 7 and 10 are disposed as far as possible in one plane, because this facilitates the attachment of the connecting lines. Conversely, above all with the use of a foil piece 8 or respectively bond wires 11, an aligned surface arrangement of this kind is not absolutely necessary, because any height differences can easily be compensated both by the foil and also by the bond wires.

It has proved particularly advantageous to use a coplanar microwave transition according to patent application DE 10 2007 013 968 A1 of the applicant for the incoming and/or outgoing line structure for the high-frequency, because, on the one hand, this achieves an optimum thermal dissipation from the semiconductor chip and, on the other hand, the optimum high-frequency coupling is achieved without interfering reflections. In the case of this microwave transition from a coaxial line to a coplanar line, the coaxial line continues in a planar internal conductor in the form of a narrow foil piece made of plastic insulating material metallised at least on one side, and the end of this planar internal conductor narrows in an adjoining transition portion to the width of a coplanar middle conductor, to which earth surfaces are guided on both sides of the middle conductor portion of the transition portion. In this context, the transition portion is preferably formed on the substrate providing the coplanar line system, which in this case then corresponds to the substrate 7 of the exemplary embodiment.

The published application DE 10 2007 013 968 A1 is incorporated by reference into the present application (incorporated by reference). The application is not restricted to the exemplary embodiment presented. All of the features described and/or illustrated can be combined with one another as required within the framework of the invention.

The invention claimed is:

1. A microwave module with at least one semiconductor chip, which provides on its upper side a connecting-line structure designed in particular as a coplanar line, and is inserted in a recess of a metal part of suitable thermal conduction and of which the connecting-line structure is connected to at least one adjacent incoming and/or outgoing line structure formed on the upper side of a substrate, characterized in that
   the semiconductor chip is glued with its underside and its lateral surfaces in the recess of a metal part by means of an adhesive with a high thermal conductivity,
   that an adhesive is used, which hardens a low temperature in such a manner that thermal stresses during manufacture are avoided,
   that the semiconductor chip is glued into the recess in such a manner that a gap between the base and the lateral walls of the recess and the underside and respectively the lateral surfaces of the semiconductor chip is completely filled, and
   that the substrate providing on its upper side the incoming and/or outgoing line structure is glued into a recess of the metal part separated from the recess of the semiconductor chip in such a manner that its upper surface is disposed in the same plane as the upper surface of the semiconductor chip.

2. The microwave module according to claim 1, characterized in that the connecting line structure of the semiconductor chip is connected to the incoming and/or outgoing line structure of the substrate via bond wires and/or via a short foil piece with corresponding connecting-line structure.

3. The microwave module of claim 1, characterized in that, as the incoming and/or outgoing line structure, a microwave transition is used, wherein a coaxial line continues within a planar internal conductor in the form of a metallized narrow foil piece made of elastic insulating material, and the end of this planar internal conductor narrows in an adjacent transition portion to the width of a coplanar middle conductor, to which earth surfaces are guided on both sides of a middle-conductor portion of the transition portion.

4. The microwave module according to claim 3, characterized in that
   the transition portion is formed on the substrate.

* * * * *

UNITED STATES PATENT AND TRADEMARK OFFICE
CERTIFICATE OF CORRECTION

| | |
|---|---|
| PATENT NO. | : 8,288,864 B2 |
| APPLICATION NO. | : 12/937967 |
| DATED | : October 16, 2012 |
| INVENTOR(S) | : W. Perndl et al. |

It is certified that error appears in the above-identified patent and that said Letters Patent is hereby corrected as shown below:

In the Claims

Column 3, Line 24, Claim 1, "hardens a low temperature" should read --hardens at a low temperature--

Signed and Sealed this
Seventeenth Day of September, 2013

Teresa Stanek Rea
*Deputy Director of the United States Patent and Trademark Office*